United States Patent
Hyakudomi

(10) Patent No.: US 7,679,387 B2
(45) Date of Patent: Mar. 16, 2010

(54) INSPECTION METHOD, INSPECTION APPARATUS, AND CONTROL PROGRAM FOR PERFORMING ELECTRICAL INSPECTION BY USING PROBE

(75) Inventor: Takanori Hyakudomi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/279,864

(22) PCT Filed: Feb. 9, 2007

(86) PCT No.: PCT/JP2007/052318
§ 371 (c)(1),
(2), (4) Date: Aug. 19, 2008

(87) PCT Pub. No.: WO2007/097207
PCT Pub. Date: Aug. 30, 2007

(65) Prior Publication Data
US 2009/0002008 A1    Jan. 1, 2009

(30) Foreign Application Priority Data
Feb. 24, 2006   (JP)  ............ 2006-048024

(51) Int. Cl.
*G01R 31/26* (2006.01)

(52) U.S. Cl. ........................... 324/754; 324/765
(58) Field of Classification Search .............. None
See application file for complete search history.

(56) References Cited

U.S. PATENT DOCUMENTS

| | | | |
|---|---|---|---|
| 6,777,967 B2 * | 8/2004 | Iino et al. | 324/757 |
| 7,262,613 B2 * | 8/2007 | Komatsu et al. | 324/754 |
| 7,301,357 B2 * | 11/2007 | Shinozaki et al. | 324/757 |
| 2007/0063725 A1 * | 3/2007 | Komatsu et al. | 324/765 |

* cited by examiner

*Primary Examiner*—Vinh P Nguyen
(74) *Attorney, Agent, or Firm*—Pearne & Gordon LLP

(57) ABSTRACT

Probes 4a and 4b having irregularities formed in leading end portions thereof are brought into contact with an electrode P of a device D, which is a target object to be inspected, at a predetermined probe pressure so that a mechanical damage is applied to an insulating film O on the electrode P. As a result, an electrical resistance value between the electrode P and the probes 4a and 4b is reduced to a first predetermined value or less. Subsequently, a fritting is performed to apply an electrical damage to the insulating film O on the electrode P so that the electrical resistance value between the electrode P and the probes 4a and 4b is set to be a second predetermined value or less which is smaller than the first predetermined value.

13 Claims, 3 Drawing Sheets

INSPECTION METHOD, INSPECTION APPARATUS, AND CONTROL PROGRAM FOR PERFORMING ELECTRICAL INSPECTION BY USING PROBE

TECHNICAL FIELD

The present invention relates to an inspection method, an inspection apparatus and a control program for performing an electrical inspection by bringing a probe into contact with an electrode of a target object to be inspected such as a semiconductor device or the like which is formed in a semiconductor wafer.

BACKGROUND ART

Conventionally, in a process of manufacturing a semiconductor device, there has been known a process of performing an electrical inspection by bringing a probe into contact with an electrode of a target object to be inspected such as a semiconductor device or the like which is formed in a semiconductor wafer. In such inspection, if the electrode making contact with the probe is made of an easily oxidizable material such as aluminum, copper, solder or the like, an insulating film such as an oxide film or the like is formed on a surface of the electrode during the inspection step. As a result, when bringing the probe into contact with the electrode, an electrical resistance therebetween becomes large so that a good electrical contact condition is not obtained. For this reason, it has been known that the electrical resistance can be reduced by breaking through the insulating film by raising a contact load (a probe pressure) applied to the electrode from the probe to be, for example, about 3 g or more.

However, in the above-described method, there are problems of causing a damage to a base of the electrode, or the like. For this reason, there has been proposed an inspection method for obtaining a good electrical contact state with a lower probe pressure by using a fritting phenomenon (for example, see Patent Document 1).

In the inspection method employing the fritting phenomenon, two probes are brought into contact with one electrode. In addition, by applying a voltage between these probes, the fritting phenomenon is incurred to thereby electrically break down the insulating film so that a good electrical contact is obtained. However, in such inspection method, since the probe pressure is low, a leading end of the probe may slide on the electrode so that the fritting is carried out without obtaining a sufficient electrical contact. Thus, it is proved that there occurs a case in which an electrical contact state required for the inspection can not be obtained even by the fritting. Accordingly, even in such inspection method, the inspection needs to be performed more accurately and reliably by obtaining a good electrical contact state more securely.

Patent Document 1: Japanese Patent Laid-open Application No. 2002-139542

DISCLOSURE OF THE INVENTION

In view of the foregoing, the present invention provides an inspection method, an inspection apparatus and a control program, capable of accurately and reliably performing an inspection by obtaining a good electrical contact state more securely in comparison with the conventional method.

In accordance with a first aspect of the present invention, there is provided an inspection method for performing an electrical inspection by bringing a probe into contact with an electrode of a target object to be inspected, including: a process of reducing an electrical resistance value between the electrode and the probe to a first predetermined value or less by bringing the probe into contact with the electrode at a predetermined load so as to apply a mechanical damage to an insulating film on the electrode; and a fritting process of reducing the electrical resistance value between the electrode and the probe to a second predetermined value or less which is smaller than the first predetermined value by applying an electrical damage to the insulating film on the electrode by means of a fritting phenomenon.

In accordance with a second aspect of the present invention, there is provided an inspection apparatus for performing an electrical inspection by bringing a probe into contact with an electrode of a target object to be inspected, wherein the inspection apparatus reduces an electrical resistance value between the electrode and the probe to a first predetermined value or less by bringing the probe into contact with the electrode at a predetermined load so as to apply a mechanical damage to an insulating film on the electrode; and then reduces the electrical resistance value between the electrode and the probe to a second predetermined value or less which is smaller than the first predetermined value by applying an electrical damage to the insulating film on the electrode by means of a fritting phenomenon.

In accordance with a third aspect of the present invention, there is provided a control program for controlling an inspection apparatus which performs an electrical inspection by bringing a probe into contact with an electrode of a target object to be inspected, the program including the steps of: reducing an electrical resistance value between the electrode and the probe to a first predetermined value or less by bringing the probe into contact with the electrode at a predetermined load so as to apply a mechanical damage to an insulating film on the electrode; reducing the electrical resistance value between the electrode and the probe to a second predetermined value or less which is smaller than the first predetermined value by applying an electrical damage to the insulating film on the electrode by means of a fritting phenomenon; and performing the electrical inspection of the target object to be inspected.

Further, in accordance with the aspects of the present invention, it is desirable that a probe leading end shaping process is performed by forming an irregularity in a leading end portion of the probe whenever a certain number of the electrical inspections on the target object to be inspected is carried out. The probe leading end shaping process may be performed by bringing the leading end portion of the probe into contact with a polishing member, and polishing the leading end portion of the probe. Furthermore, it is possible that the probe leading end shaping process is performed by bringing the leading end portion of the probe into contact with the polishing member, and moving each other in a horizontal direction.

In accordance with the aspects of the present invention, it is possible that the fritting process is performed by bringing the electrode into contact with the probe and a probe for fritting, and applying a voltage between the probe and the probe for fritting.

In accordance with the aspects of the present invention, it is desirable that the first predetermined value is 1 M$\Omega$, and the predetermined load is 1 g or less.

BEST MODE FOR CARRYING OUT THE INVENTION

Hereinafter, embodiments of the present invention will be described in detail with reference to the accompanying drawings.

Figure 1:
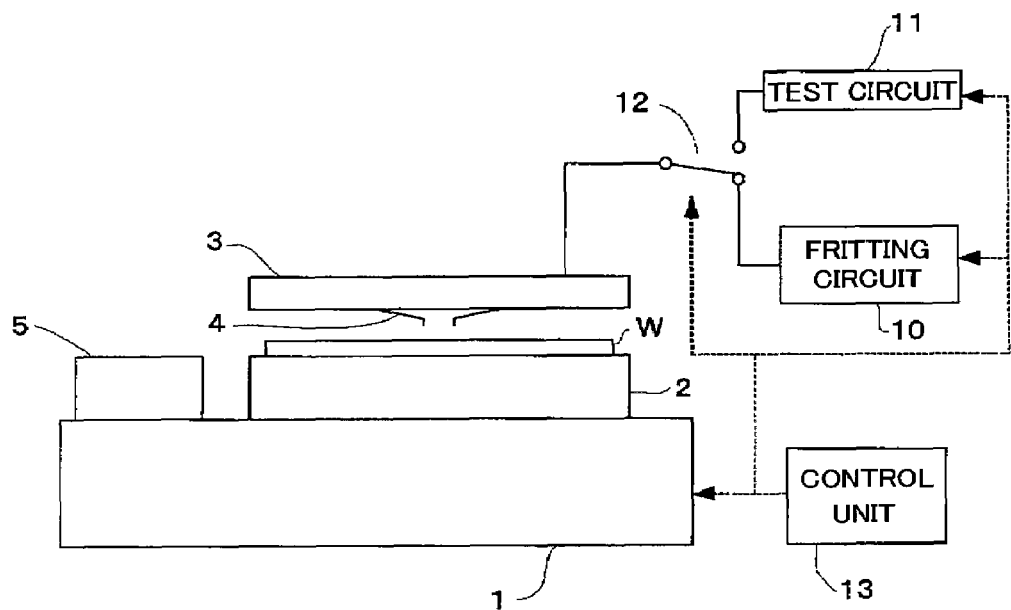
FIG. 1 is a schematic configuration view of principal parts of a probe apparatus in accordance with an embodiment of the present invention.

FIG. 1 is a schematic configuration view of an inspection apparatus in accordance with an embodiment of the present invention. As shown in FIG. 1, the inspection apparatus includes a driving table 1 which allows the inspection apparatus to move along X-Y-Z directions. Installed on the driving table 1 is a mounting table 2 on which a semiconductor wafer W, which is a target object to be inspected, can be mounted. Further, a probe card 3 is disposed above the mounting table 2, and a plurality of probes 4 are installed at the probe card 3. Furthermore, disposed at a side of the mounting table 2 on the driving table 1 is, for example, a polishing unit 5 having a polishing member such as an abrasive sheet or the like. The polishing unit 5 serves to polish and clean a leading end portion of the probe 4, and at the same time, to perform a shaping process of the probe leading end, which forms an irregularity at the leading end portion of the probe 4.

The probe 4 of the probe card 3 is connected to a test circuit (a tester) 11 and a fritting circuit 10 via a switch 12. Further, by switching the switch 12, an electrical connection state between the probe 4 and the test circuit 11 or between the probe 4 and the fritting circuit 10 can be selected.

The driving table 1, the switch 12, the fritting circuit 10 and the test circuit 11 are connected to a control unit 13. Also, a driving of the driving table 1, a switching of the switch 12, a start of fritting by the fritting circuit 10, a start of electrical test (inspection) by the test circuit 11 and the like are executed by a signal from the control unit 13. The control of the inspection apparatus by the control unit 13 is executed based on a control program (software). The control program may be stored in a computer storage medium (for example, hard disk, CD, flexible disk, semiconductor memory, and so forth) which is readable by a computer, or may be utilized by transmitting the program online at any time via, e.g., a dedicated line from other apparatus.

Figure 2:
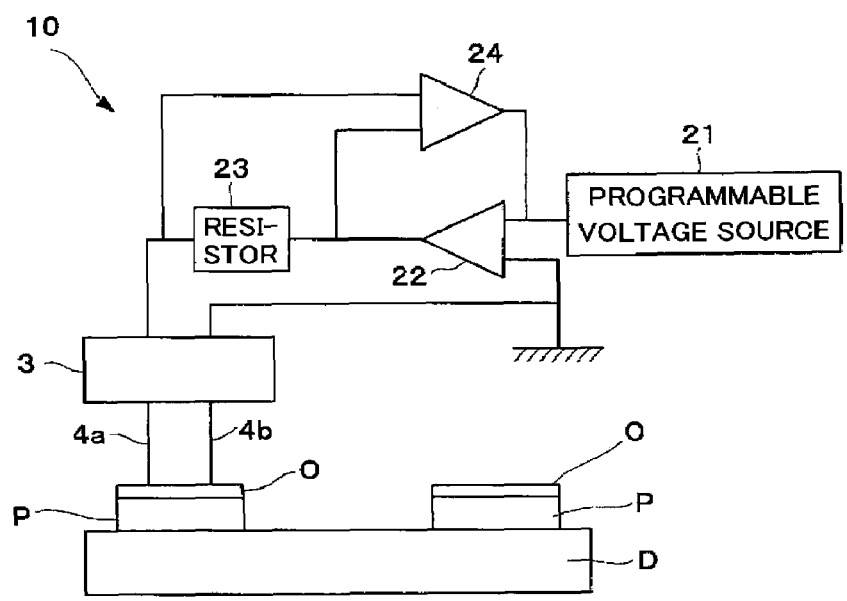
FIG. 2 shows a configuration view of a fritting circuit of the probe apparatus of FIG. 1.

Here, a fritting phenomenon refers to a phenomenon in which, when a potential gradient applied to an insulating film such as an oxide film and the like formed on a surface of a metal (an electrode in the present embodiment) becomes about $10^5$ to $10^6$ V/cm, an electric current flows due to a non-uniformity in a thickness of the insulating film or a composition of the metal, thereby breaking down the insulating film. FIG. 2 shows a schematic configuration view of the fritting circuit 10 for incurring such fritting phenomenon. As shown in FIG. 2, the fritting circuit 10 includes a programmable voltage source 21, a voltage application buffer amplifier 22, a current sense resistor 23 and an application current limiter 24. The fritting circuit 10 is configured so that a voltage is applied to probes 4a and 4b of the probe card 3 from the programmable voltage source 21.

The probe 4a is connected to the voltage application buffer amplifier 22 via the current sense resistor 23. Further, the probe 4b is connected to an input terminal side of the voltage application buffer amplifier 22 while being grounded. The probes 4a and 4b are made of, for example, a conductive metal such as tungsten (W), beryllium copper alloy (BeCu), palladium (Pd) or the like. Furthermore, a diameter of leading ends of the probes 4a and 4b is selected according to a size of an electrode of an target object, and thus, if the target object is an semiconductor device, the diameter is, for example, about 20 μm.

One of the probes 4a and 4b, for example, the probe 4a is for inspecting, and it can be used in an electrical inspection by the test circuit 11 as well as in a fritting by the fritting circuit 10. Meanwhile, the other probe 4b is for fritting by the fritting circuit 10, and when performing the electrical inspection by the test circuit 11, it becomes an electrically floating state.

The irregularities are formed in the leading end portions of the probes 4a and 4b by making contact with the polishing unit 5 and polishing them. That is, the leading end portions of the probes 4a and 4b are pressed against the polishing unit 5 at a predetermined load by driving the driving table 1, and in this state, the polishing unit 5 is moved in a horizontal direction so that the leading end portions are polished and shaped, resulting in a formation of the irregularities. Desirably, a surface roughness (an arithmetical mean surface roughness (Ra)) of the probes 4a and 4b due to the irregularities is set to be, for example, about 0.5 μm or more. Further, at this time, it is desirable that a particle diameter of the polishing unit 5 is about 2 μm or more.

In this manner, if the probes 4a and 4b having the irregularities formed in the leading end portions thereof are brought into contact with an electrode P of a semiconductor device D, which is a target object to be inspected, at a low probe pressure (for example, about 1 g or less), the probes 4a and 4b penetrate into an insulating film O without being slid on the electrode P so that a mechanical damage is applied to the insulating film O on the electrode P. As a result, it is possible to reduce an electrical resistance value between the electrode P and the probes 4a and 4b to a first predetermined value or less, for example, about 1 MΩ or less (about several hundred kilo Ω). The resistance value at this time is too high so that it is insufficient for performing the electrical inspection of the device D. However, this is sufficient for performing the fritting, so that the fritting is carried out by the fritting circuit 10 in this state, thereby incurring an electrical damage to the insulating film O on the electrode P by the fritting phenomenon. As a result, it is possible to reduce an electrical resistance value between the electrode P and the probes 4a and 4b to a second predetermined value or less which is smaller than the first predetermined value, for example, about 1/10 or less than the first predetermined value. In other words, by performing the two-step breakdown on the insulating film O using the mechanical breakdown and the electrical breakdown by the fritting, it is possible to acquire a good electrical contact state more securely even with a low probe pressure in comparison with the conventional method. Accordingly, it is possible to perform the inspection more accurately and reliably.

Figure 3:
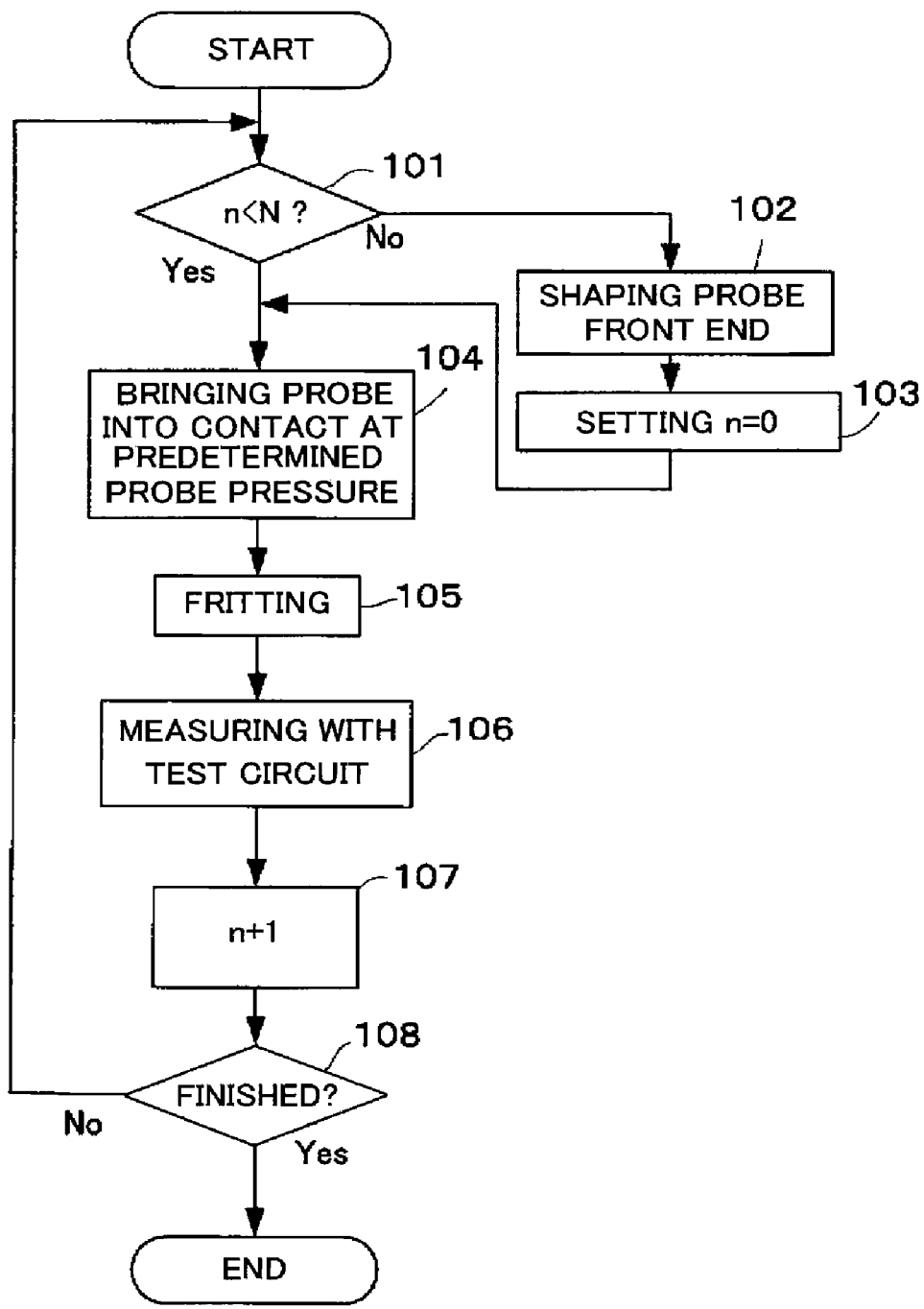
FIG. 3 presents a flow chart for explaining an inspection method performed by the probe apparatus of FIG. 1.

Next, referring to FIG. 3, an operation of the inspection apparatus having the above-mentioned configuration will be described. As shown in FIG. 3, first, the control unit 13 determines whether the number of inspection times n performed until now is less than the number of predetermined times N (for example, 100 times) (101). Thereafter, if the number of inspection times n reaches the number of predetermined times N, a shaping of the probe leading end is performed (102), and then the number of inspection times n is cleared and set to be 0 (103). In the process of shaping the probe leading end, the leading end portions of the probes 4a and 4b are pressed against the polishing unit 5 at a predetermined load by driving the driving table 1, and in this state, the driving table 1 is moved in a horizontal direction. While the leading end portions of the probes 4a and 4b are in contact with the polishing unit 5, the polishing unit 5 slides to polish the leading end portions, thereby forming irregularities by making the surface state thereof rough.

After the process of shaping the probe leading end, or when the number of inspection times n is less than the number of predetermined times N, the process of shaping the probe leading end is not performed. Then, the probe card 3's probes 4a and 4b having the irregularities formed in the leading end portions thereof are brought into contact with the electrode P of the device D, which is a target object to be inspected, at a predetermined probe pressure (for example, about 1 g or less) (104). In this manner, by bringing the probes 4a and 4b having the irregularities formed in the leading end portions thereof into contact with the electrode P of the semiconductor device D, which is the target object to be inspected, at a low probe pressure (for example, about 1 g or less), the mechanical damage is applied to the insulating film O on the electrode P so that it is possible to reduce the electrical resistance value between the electrode P and the probes 4a and 4b to the first predetermined value or less, for example, about 1 MΩ or less.

Subsequently, the fritting is performed while the electrical resistance value between the electrode P and the probes 4a and 4b is set to be the first predetermined value or less as described above, so that the electrical damage is applied to the insulating film O on the electrode P, thereby reducing the electrical resistance value between the electrode P and the probes 4a and 4b to the second predetermined value or less which is smaller than the first predetermined value (105). In this fritting process, the switch 12 shown in FIG. 1 is switched to the fritting circuit 10, and in this state, the programmable voltage source 21 shown in FIG. 2 is operated. Further, if the voltage is applied to the probe 4a via the voltage application buffer amplifier 22 and the current sense resistor 23, a very little amount of tunneling current flows at first if the insulating film O is very thin. From this state, if the voltage of the programmable voltage source 21 is gradually raised, the potential gradient between the probes 4a and 4b gradually becomes large. When the potential gradient reaches a predetermined value (about $10^5$ to $10^6$ V/cm), the fritting phenomenon occurs, resulting in the breakdown of the insulating film O on the electrode P. Accordingly, the probes 4a and 4b are brought into contact with a metal surface of the electrode P, and an electric current between the probe 4a and the probe 4b becomes large rapidly. The application current limiter 24 detects this electric current, and cuts off an application of the voltage from the voltage application buffer amplifier 22 to prevent a larger electric current from flowing. As a result, it is possible that the electrical resistance value between the probes 4a and 4b and the electrode P is set to be the second predetermined value or less (for example, about 1/10 of the first predetermined value) which is smaller than the first predetermined value.

Thereafter, the switch 12 shown in FIG. 1 is switched to the test circuit 11, and the electrical inspection of the semiconductor device D is performed by the test circuit 11 (106). Then, 1 is added to the number of executed inspection times n (107), and then it is determined whether the inspection is finished or not (108). The above-described process is repeatedly carried out until the inspection of all the semiconductor devices D to be inspected is finished. Thereafter, the process is terminated.

Figure 4A:
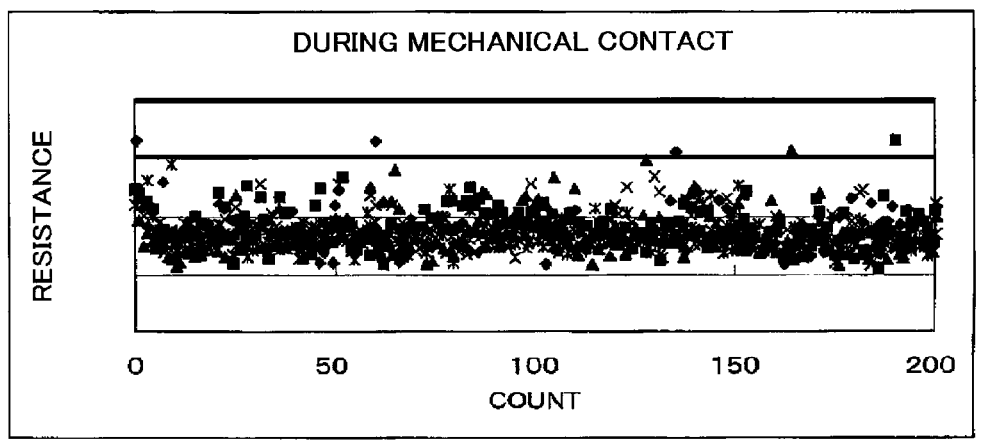
FIG. 4 sets forth graphs showing results of resistance values measured during a mechanical contact and after a fritting.
Figure 4B:
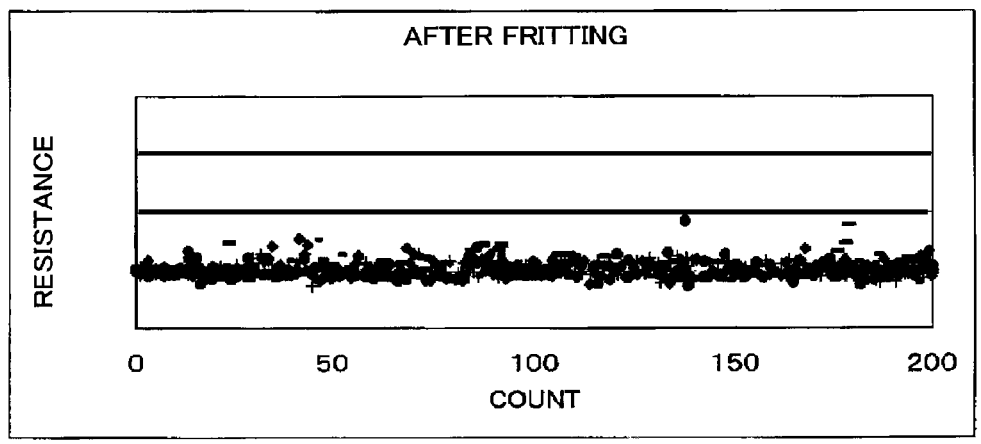

In FIGS. 4A and 4B, a longitudinal axis represents a resistance value (logarithmic scale) and a horizontal axis represents a count number (the number of measurement times). FIGS. 4A and 4B show a real measurement value (FIG. 4A) of the electrical resistance value between the probes 4a and 4b and the electrode P during the mechanical contact in the above-mentioned process, in comparison with a real measurement value (FIG. 4B) of the electrical resistance value between the probes 4a and 4b and the electrode P after the fritting, which are measured with respect to a plurality of probes. As shown in FIGS. 4A and 4B, before the fritting, the resistance values are high and an unevenness of the resistance values is great. However, by performing the fritting in this state, it was possible to lower the resistance values and reduce the unevenness of the resistance values.

In accordance with the present embodiment, it is possible to obtain a good electrical contact state more securely in comparison with the conventional method so that it is possible to perform the inspection more accurately and reliably. Moreover, the present invention is not limited to the above-described embodiments, and various modifications thereof can be made. For example, in the above-described embodiments, the polishing unit 5 is installed on the driving table 1, and the leading end portion of the probe 4 is pressed against the polishing unit 5. In this state, the polishing unit 5 is moved in a horizontal direction to polish the leading end portion, so that the leading end portion of the probe 4 is shaped to have irregularities. However, it is possible that the polishing member may be separately introduced, and it is also possible to move the probe 4. Further, it is also possible that the process of shaping the leading end portion of the probe 4 is carried out at different timings, e.g., after inspections of a certain number of the semiconductor wafers W in lieu of a certain number of inspections.

INDUSTRIAL APPLICABILITY

The inspection method, the inspection apparatus and the control program in accordance with the present invention are applicable in a field of manufacturing the semiconductor device or the like. Accordingly, the present invention has industrial applicability.

What is claimed is:

1. An inspection method for performing an electrical inspection by bringing a probe into contact with an electrode of a target object to be inspected, comprising:
    a process of reducing an electrical resistance value between the electrode and the probe to a first predetermined value or less by bringing the probe into contact with the electrode at a predetermined load so as to apply a mechanical damage to an insulating film on the electrode;
    a fritting process of reducing the electrical resistance value between the electrode and the probe to a second predetermined value or less which is smaller than the first predetermined value by applying an electrical damage to the insulating film on the electrode by means of a fritting phenomenon;
    a switching process of connecting the probe to a test circuit from a fritting circuit;
    a process of performing the electrical inspection of the target object by the test circuit; and
    performing a probe leading end shaping process by forming an irregularity in a leading end portion of the probe whenever a preset number of the electrical inspections on the target object to be inspected is carried out.

2. The inspection method of claim 1, wherein the probe leading end shaping process is performed by bringing the leading end portion of the probe into contact with a polishing member, and polishing the leading end portion of the probe.

3. The inspection method of claim 2, wherein the probe leading end shaping process is performed by bringing the leading end portion of the probe into contact with the polishing member, and moving each other in a horizontal direction.

4. The inspection method of claim 1, wherein the fritting process is performed by bringing the electrode into contact with the probe and a probe for fritting, and applying a voltage between the probe and the probe for fritting.

5. The inspection method of claim 1, wherein the first predetermined value is 1 MΩ.

6. The inspection method of claim 1, wherein the predetermined load is 1 g or less.

7. An inspection apparatus for performing an electrical inspection by bringing a probe into contact with an electrode of a target object to be inspected, the apparatus comprising:
   a fritting circuit for applying a fritting voltage to the probe;
   a test circuit for applying a test voltage to the probe; and
   a control unit for controlling the fritting circuit and the test circuit,
   wherein the control unit controls the inspection apparatus to reduce an electrical resistance value between the electrode and the probe to a first predetermined value or less by bringing the probe into contact with the electrode at a predetermined load so as to apply a mechanical damage to an insulating film on the electrode,
   the control unit controls the inspection apparatus to reduce the electrical resistance value between the electrode and the probe to a second predetermined value or less which is smaller than the first predetermined value by applying an electrical damage to the insulating film on the electrode by means of a fritting phenomenon,
   the control unit controls the inspection apparatus to connect the probe to the test circuit from the fritting circuit and to perform the electrical inspection of the target object by the test circuit, and
   the control unit controls the inspection apparatus to form an irregularity in a leading end portion of the probe whenever a preset number of the electrical inspections on the target object to be inspected is carried out.

8. The inspection apparatus of claim 7, wherein the inspection apparatus forms the irregularity in the leading end portion of the probe by bringing the leading end portion of the probe into contact with a polishing member, and polishing the leading end portion of the probe.

9. The inspection apparatus of claim 8, wherein the inspection apparatus brings the leading end portion of the probe into contact with the polishing member, and moves each other in a horizontal direction.

10. The inspection apparatus of claim 7, wherein the fritting phenomenon is incurred by bringing the electrode into contact with the probe and a probe for fritting, and applying a voltage between the probe and the probe for fritting.

11. The inspection apparatus of claim 7, wherein the first predetermined value is 1 MΩ.

12. The inspection apparatus of claim 7, wherein the predetermined load is 1 g or less.

13. A control program for controlling an inspection apparatus which performs an electrical inspection by bringing a probe into contact with an electrode of a target object to be inspected, the program allowing a computer to execute the processes of:
   reducing an electrical resistance value between the electrode and the probe to a first predetermined value or less by bringing the probe into contact with the electrode at a predetermined load so as to apply a mechanical damage to an insulating film on the electrode;
   reducing the electrical resistance value between the electrode and the probe to a second predetermined value or less which is smaller than the first predetermined value by applying an electrical damage to the insulating film on the electrode by means of a fritting phenomenon;
   connecting the probe to a test circuit from a fritting circuit;
   performing the electrical inspection of the target object to be inspected by the test circuit; and
   forming an irregularity in a leading end portion of the probe whenever a preset number of the electrical inspections on the target object to be inspected is carried out.

* * * * *